US012624473B2

(12) United States Patent (10) Patent No.: US 12,624,473 B2
Rogers et al. (45) Date of Patent: May 12, 2026

(54) DNA-PROGRAMMED PHOTONIC CRYSTAL FABRICATION PROCESSES

(71) Applicants: Brandeis University, Waltham, MA (US); The Trustees of Princeton University, Princeton, NJ (US)

(72) Inventors: William Benjamin Rogers, Watertown, MA (US); Alexander Hensley, Waltham, MA (US); William M. Jacobs, New York, NY (US)

(73) Assignees: BRANDEIS UNIVERSITY, Waltham, MA (US); PRINCETON UNIVERSITY, Princeton, NJ (US)

( * ) Notice: Subject to any disclaimer, the term of this patent is extended or adjusted under 35 U.S.C. 154(b) by 348 days.

(21) Appl. No.: 18/490,513

(22) Filed: Oct. 19, 2023

(65) Prior Publication Data

US 2024/0141545 A1 May 2, 2024

Related U.S. Application Data

(60) Provisional application No. 63/380,258, filed on Oct. 20, 2022.

(51) Int. Cl.
  *C30B 7/08* (2006.01)
  *B01J 13/00* (2006.01)
  *C30B 29/58* (2006.01)
(52) U.S. Cl.
  CPC .............. *C30B 7/08* (2013.01); *B01J 13/0026* (2013.01); *C30B 29/58* (2013.01)
(58) Field of Classification Search
  CPC ... C30B 7/00; C30B 7/08; C30B 29/58; B01J 23/0026
  See application file for complete search history.

(56) References Cited

U.S. PATENT DOCUMENTS 9,433,943 B2 * 9/2016 Bashir .................... C12Q 1/686
2014/0256594 A1 * 9/2014 Feng .................... C12Q 1/6876
  506/32

(Continued)

FOREIGN PATENT DOCUMENTS

CN 104338333 A * 2/2015
WO WO-9930835 A1 * 6/1999 .......... A61M 15/025

OTHER PUBLICATIONS

Feng et al "Specificity, flexablitly and valance of DNA bonds guide emulsions architecture" arXiv.org e-print archive, condensed matter, 2013 vol. 1 (19).*

(Continued)

*Primary Examiner* — Robert M Kunemund
(74) *Attorney, Agent, or Firm* — CANTOR COLBURN LLP

(57) ABSTRACT

A two-step process is provided for forming large photonic single crystals of about 0.1 millimeter and greater via DNA coated colloidal particles. The two-step process generally include decoupling the nucleation and growth steps. In particular, DNA colloidal particles are partitioned in nano-liter droplets formed in a water in oil emulsion using microfluidics. Once a crystal nucleates within a droplet, depletion of particles occurs as the crystal grows inhibit formation of more crystals within the droplet. A small number of droplets containing these seed crystals are then mixed with droplets containing weak DNA coated colloidal particles. The emulsion is then broken and heated at a temperature effective to cause dissociation of the weak particles while the seeds remain stable. The system is further cooled at a temperature effective that the particles stably adhere to the seed crystals resulting in growth while inhibiting nucleation of new crystals.

14 Claims, 4 Drawing Sheets

Specification includes a Sequence Listing.

Step Two: Diffusion-Limited Growth from Single-Crystal Seeds

(56) References Cited

U.S. PATENT DOCUMENTS

| | | | | |
|---|---|---|---|---|
| 2014/0330002 | A1* | 11/2014 | Brujic | A61K 8/64 |
| | | | | 536/23.1 |
| 2020/0166503 | A1* | 5/2020 | Swager | G01N 21/55 |
| 2020/0249092 | A1* | 8/2020 | Podmore | G01M 3/38 |
| 2022/0011236 | A1* | 1/2022 | Mason | G01N 27/44756 |

OTHER PUBLICATIONS

Caciagli et al, "Optical trapping of colloids at a liquid-liquid interface". arXiv: 1703.08210v1 [cond-mat.soft] Mar. 23, 2017.*
He et al, "Colloidal particales with triangular patches" pubs.acs. org/langmuir 7246-7253 2021 vol. 37.*

\* cited by examiner

SEQUENCE LISTING

```
Sequence total quantity: 2
SEQ ID NO: 1            moltype = DNA  length = 65
FEATURE                 Location/Qualifiers
source                  1..65
                        mol_type = other DNA
                        organism = synthetic construct
SEQUENCE: 1
tttttttttt tttttttttt tttttttttt tttttttttt tttttttttt tgagttgcgg  60
tagac                                                               65

SEQ ID NO: 2            moltype = DNA  length = 65
FEATURE                 Location/Qualifiers
source                  1..65
                        mol_type = other DNA
                        organism = synthetic construct
SEQUENCE: 2
tttttttttt tttttttttt tttttttttt tttttttttt tttttttttt taatgcctgt  60
ctacc                                                               65
```

DNA-PROGRAMMED PHOTONIC CRYSTAL FABRICATION PROCESSES

CROSS REFERENCE TO RELATED APPLICATIONS

The present application claims the benefit of U.S. Provisional Application No. 63/380,258, filed on Oct. 20, 2022, which is hereby incorporated herein by reference in its entirety.

GOVERNMENT SUPPORT

This invention was made with government support under DMR1710112 awarded by the National Science Foundation. The government has certain rights in the invention.

SEQUENCE LISTING

The Instant Application contains a Sequence Listing which has been submitted electronically in XML format and is hereby incorporated by reference in its entirety. Said XML copy, created on Jan. 18, 2024, is named "9F07961" and is 2,903 bytes in size. The Sequence Listing does not go beyond the disclosure in the application as filed.

BACKGROUND

The present disclosure generally relates to photonic crystals, and more specifically, processes for fabricating photonic crystals using DNA programmed interactions.

Photonic crystals are optical metamaterials, meaning their optical properties are derived from not just their material composition but from the structure of the material itself. It has been shown that crystal lattices of spherical particles roughly the diameter of half the wavelength of visible light can reflect and transmit light in novel ways that haven't been achieved with uniformly solid bulk materials. Using programmable self-assembly of DNA-coated nano- and microparticles is a common way to self-assemble colloidal particles into ordered photonic structures and can even lead to colloidal crystals that are as of yet impossible to assemble any other way, such as colloidal diamond, which is predicted to exhibit a complete photonic bandgap of visible frequencies.

To self-assemble these metamaterials from DNA-coated particles, most labs use a single step process that generally includes bulk nucleation and growth of the crystals. In these processes, the temperature of the system is raised until the particles disassociate, which is then lowered to a constant temperature where stochastic nucleation occurs. Then, the temperature is held until the nucleated crystals have grown. The temperature at which crystallization of DNA-coated colloidal particles occurs is slightly below the melting point of the particles (i.e., temperature at which the particles disaggregate) and requires careful temperature control because of the vastly different length scales between the nanometer-scale DNA molecules and the micrometer-scale colloidal particles, which leads to crystallization kinetics that are extremely sensitive to temperature and therefore prone to kinetic trapping. For example, recent work has shown that the crystal nucleation rates vary by orders of magnitude over a temperature range of only 0.25° C. As a result, it has proven difficult to assemble single crystalline materials using DNA programmed self-assembly that are larger than a few dozen micrometers in size. Instead, the larger self-assembled crystals are typically polycrystalline with heterogeneous domain sizes. Moreover, with many nuclei growing at random positions and times within the sample, these crystals compete for resources with each other or begin to cluster together into polycrystals that may not have uniform optical properties. This competition in crowding also tends to lead to a large spread in crystal size and limit the maximum size of the crystals to a few dozen micrometers, which limits the practical application of these materials.

SUMMARY

Embodiments of the present disclosure are generally directed to processes for forming the crystals from DNA coated colloidal particles. A non-limiting example process of fabricating a crystal from DNA coated colloids according to embodiments of the disclosure includes a two-step process including a first step of nucleating single seed crystals in droplets formed in a water in oil emulsion by cooling the emulsion from above a melting temperature of the seed crystal to a nucleation temperature, wherein each of the monodisperse droplets comprise a binary suspension of DNA coated colloidal particles having a first grafting density of DNA; and a second step of growing the single seed crystals to form larger three-dimensional crystals by mixing a portion of the monodisperse droplets containing the single seed crystals with monodisperse droplets containing weakly DNA coated colloidal particles, wherein the weakly DNA coated colloidal particles have a second grafting density of DNA less than the first grafting density followed by breaking the emulsion to form a metastable colloidal suspension including the seed crystals, and annealing the metastable colloidal suspension at a temperature greater than the melting temperature of the weakly DNA coated particles and less than a melting temperature of the seed crystal to form the larger three-dimensional crystals, wherein growth of the seed crystals is diffusion limited, and wherein the melting temperature of the weakly DNA coated particles is greater than a nucleation temperature during the growing.

In one or more other embodiments, a process for nucleating single seed crystals in a droplet includes forming monodisperse water droplets in a water in oil emulsion filled with a binary mixture of DNA coated colloidal particles, wherein the binary mixture of the DNA coated particles comprises complementary DNA strands grafted to colloidal particles; heating the water in oil emulsion to a temperature greater than melting temperature of the DNA coated colloidal particles to effect disaggregation of the DNA coated colloidal particles; and cooling below the melting temperature in a staircase fashion for a defined intervals of time to form a single crystal within the droplets by hybridization of the DNA coated colloidal particles.

In still one or more other embodiments, a process for growing macroscopic crystals, includes mixing droplets containing seed crystals formed from DNA coated colloidal particles with droplets containing weak DNA coated colloidal particles having a lower nucleation temperature than the droplets containing seed crystals from the DNA coated colloidal particles; breaking the emulsion to form a metastable DNA coated colloidal particle suspension including the seed crystals; annealing the mixture at a temperature above the nucleation temperature of the weak DNA coated particles but below a melting temperature of the seed crystals; and decreasing the temperature to grow larger crystals from the seed crystals with the weak DNA coated colloidal particles.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figures 1A, 1B:
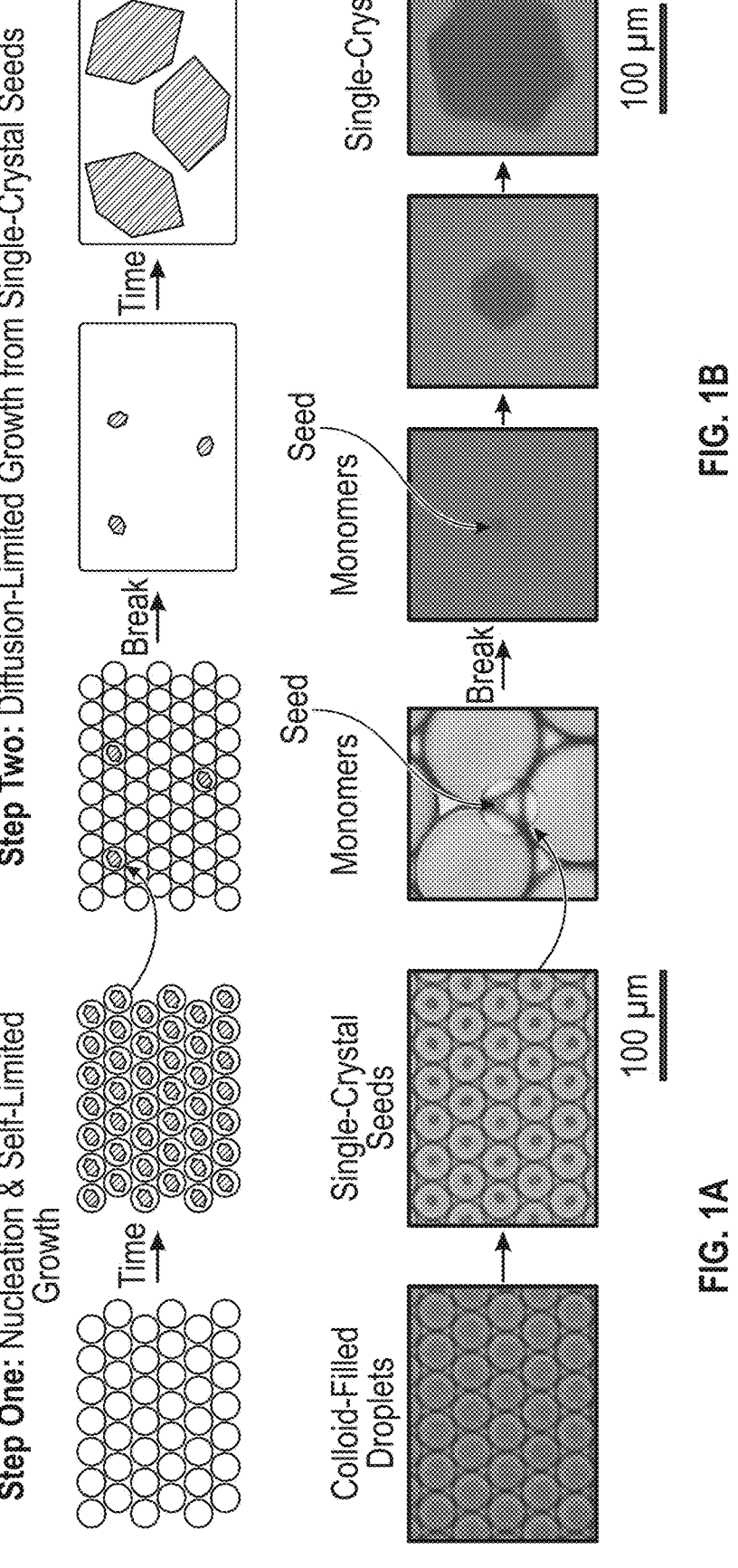
FIGS. 1A and 1B schematically and micrographically illustrate a two-step process including a first step of nucleation and self-limited growth to form seed crystals and a second step including diffusion-limited growth from single crystal seeds, respectively, according to one or more embodiments of the present disclosure.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

The present disclosure overcomes the problems noted in the prior art as it relates to bulk nucleation of DNA coated colloidal particles and is generally directed to a two-step process, wherein the nucleation step and the subsequent growth step are decoupled from one another. The two-step process provides a robust process for fabricating uniform and large crystals that is markedly less temperature sensitive than prior art one step processes. The two-step process, as will be described in greater detail below, generally includes a nucleation step to form small uniform single crystal seeds within monodisperse water droplets formed in a water in oil emulsion made via microfluidics that are filled with a binary mixture of DNA coated colloidal particles that interact by hybridization of complementary DNA strands grafted to the colloidal particles, which induces a short-range attraction whose strength can be tuned by adjusting the temperature.

The single nucleated crystal seeds are then recovered and used in a separate growth step to effect further crystal growth of the seed crystals in a colloidal metastable suspension in which the single crystal seeds three dimensionally grow, wherein further nucleation of new crystals in this second step is not favored. Advantageously, the two-step process results in relatively large crystals unhindered by competition from other nuclei, which can provide crystal sizes that can be macroscopic and at least an order of magnitude greater than prior art one-step bulk nucleation processes. Moreover, unlike the prior art one-step bulk nucleation processes, the two-step process is insensitive to small changes in processing conditions and can be repeated over and over again, in contrast to most prior art colloidal self-assembly protocols. Still further, the two-step process can be used to provide uniform crystal sizes and desired crystalline symmetries.

Various embodiments of the disclosure are described herein with reference to the related drawings. Alternative embodiments of the disclosure can be devised without departing from the scope of this disclosure. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e., one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

For the sake of brevity, conventional techniques related to making and using aspects of the disclosure may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Moreover, numerous specific details are set forth in the following description, such as particular structures, components, materials, dimensions, processing steps and techniques, in order to provide a thorough understanding of the present invention. However, it will be appreciated by one of ordinary skill in the art that the present invention can be practiced without these specific details. In other instances, well-known structures or processing steps have not been described in detail in order to avoid obscuring the present invention. Conventional techniques related to photonic crystals formed using DNA self-assembly may or may not be described in detail herein. Moreover, the various tasks and process steps described herein can be incorporated into a more comprehensive procedure or process having additional steps or functionality not described in detail herein. In particular, various steps in the manufacture of photonic crystals are well known and so, in the interest of brevity, many conventional steps will only be mentioned briefly herein or will be omitted entirely without providing the well-known process details.

Turning now to FIGS. 1A and 1B, there is depicted a two-step process in accordance with one or more embodiments of the present disclosure configured to decouple the nucleation step from the growth step during self-assembly from DNA-coated colloids, which were typically combined in the prior art one-step bulk nucleation processes, to form relatively large macroscopic photonic crystals exhibiting bulk metamaterial properties. In FIG. 1A, nucleation and self-limited growth of seed crystals from a metastable bulk solution within droplets filled with DNA coated colloidal particles formed from a water in oil emulsion are depicted, and in FIG. 1B, subsequent diffusion-limited growth of crystals from the single crystal seeds recovered after nucleation is depicted.

In the illustrated first step depicted in FIG. 1A, a binary mixture of the same-sized DNA coated colloidal particles was crystallized to form a colloidal alloy that was isostructural to copper gold (fcc). More specifically, the first step included nucleation and self-limited growth of seed crystals within nanoliter-scale microfluidic droplets filled with DNA coated colloidal particles in the form of a water-in-oil emulsion and subjecting the DNA coated colloidal filled droplets to a relatively simple cooling protocol. It should be apparent that although reference is made to crystalline symmetries isostructural to gold copper, the present disclosure is not intended to be limited to any particular crystalline symmetry as the two-step process described herein can be configured to provide three dimensional seeds that are isostructural to a desired crystal structure, e.g., colloidal diamond or the like. Different crystalline symmetries can generally be obtained by changing where on the particle the DNA is attached.

The cooling protocol nucleates a seed crystal within a given droplet and provides self-limited growth within the confines of the droplet, which can contain thousands of DNA coated colloidal particles. The cooling protocol can be continuous or stepwise. Nucleation occurs because the DNA-programmed attractions become stronger with decreasing temperature, which eventually results in one or more crystals nucleating within the droplet, leading to an ensemble of polycrystals or monodisperse single crystals throughout the droplets formed in the emulsion. Generally, cooling starts at a temperature above the melting temperature and continues until all of the particles within a given droplet are incorporated into the crystal, i.e., forms a single seed crystal. After each cooling interval, the fraction of droplets that grow only a single crystal as a function of the cooling rate and droplet diameter can be measured and optimized such that most of the droplets within the emulsion advantageously contain single seed crystals, not polycrystals. As shown in the brightfield micrographs depicted in FIG. 1A, single crystals of the same-size and shape were formed within each of the monodisperse droplets.

In FIG. 1B, the second step included diffusion-limited growth of the single crystal seeds that were obtained in the nucleation step to form macroscopic three-dimensional crystals. Diffusion-limited growth generally involves recovering droplets containing the single seed crystals obtained during the first step of nucleation and self-limited growth shown in FIG. 1A and mixing a relatively small number of these recovered droplets containing single seed crystals with droplets containing weakly DNA coated colloidal particles (without crystals). The term "weakly DNA coated" is relative and generally refers to the amount of DNA used to functionalize the particles relative to the amount of DNA used during the first step and is about 1° or 2° C. lower in nucleation temperature than the "strong" particles in order to have a binding free energy of roughly 4 or 5 kBT, where nucleation typically occurs. Generally, the weaker DNA coated colloidal particles having the lower nucleation can be formed by using about half the amount of DNA to coat the particles, which results in significantly weaker particle interactions.

The ratio of seed droplets to weak droplets is between about 0.1% to about 0.01%. At higher percentages, the issue of overcrowding as observed in bulk nucleation processes can occur since the proximity to other seed crystals increases, and at lower percentages, it can be difficult to find seeds with crystals.

Figure 2A:
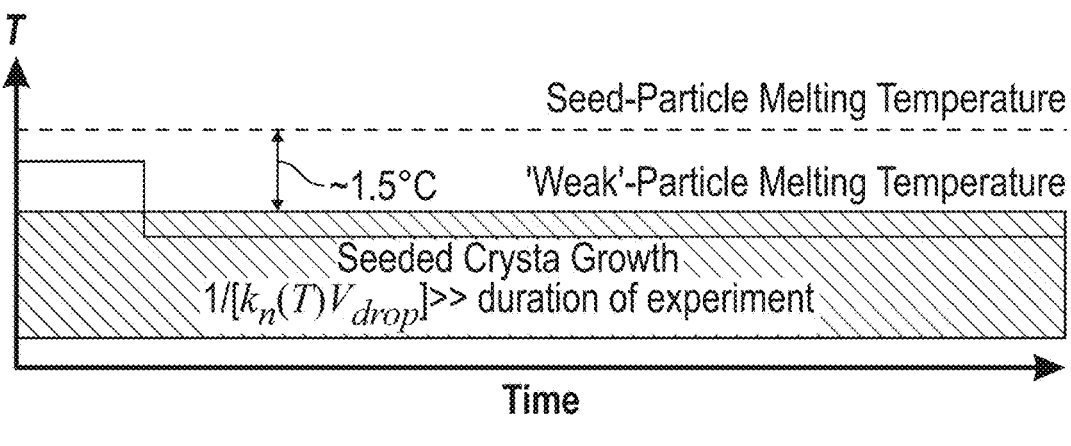
FIG. 2A graphically illustrates temperature as a function of time for an exemplary cooling protocol for seeded growth in accordance with one or more embodiments of the present disclosure.

The emulsion is then broken and used to seed diffusion-limited crystal growth in a metastable colloidal suspension of the weakly DNA coated colloidal particles resulting from the broken emulsion as shown in a schematic (top) and in brightfield micrographs (bottom) of FIG. 1B. This second step exploits the fact that the particles are able to attach to a crystal surface at a higher temperature, and thus lower supersaturation than at which nucleation occurs. The system is then annealed at a temperature above the homogeneous nucleation temperature of the weak particles but below the melting temperature of the crystalline seed. An example of a cooling protocol is provided in FIG. 2A. The supersaturation of the particles in the metastable colloidal suspension is kept roughly constant such that the seeds can grow but homogeneous nucleation is advantageously suppressed.

To provide diffusion-limited growth of the single crystal seeds, a low density of seed crystals is used. An acceptable low density of seed crystals can be obtained by adding 1 µl of droplets with the single seed crystals to 4 µl of droplets including weakly DNA coated colloidal particles. Then, 1 µl of this mixture is added to 4 µl of droplets including weakly DNA coated colloidal particles and so on for a total of three dilutions. Finally, a fourth dilution adds 1 µl of this diluted mixture to 9 µl of droplets containing weakly DNA coated colloidal particles.

The emulsion of a small number of crystal-containing droplets and the droplets containing weak DNA coated particles is then broken and the sample heated to cause the weak particles to dissociate until the combined system is in equilibrium. Breaking the emulsion is not intended to be limited. For example, the emulsion can be broken by exposing the fluid to an energy source such as an ionizer, which combines the seed crystals with the dissociated particles. Alternatively, a demulsifying agent or the like can be added.

As noted above, the temperature is selected such that the seed crystals remain stable after breaking the emulsion at the elevated temperature whereas the weaker DNA coated colloidal particles, whose DNA grafting density is reduced by half, dissociate from each other. The resulting lower melting temperature of the weaker particles allows these particles to exist in the gas phase at temperatures below the melting point of the seed crystals themselves. The system is thus annealed at a temperature above the homogeneous nucleation temperature of the crystalline seed and supersaturation kept substantially constant so that the seeds can grow but homogeneous nucleation is suppressed.

The temperature, which is below the melting temperature of the seed crystals and above the homogeneous nucleation temperature, permits the particles to stably adhere to the surface of any already formed seed crystals but are unable to nucleate into new crystals. This allows only the seed crystals that were placed in the system from the start of the second step to grow. In this manner, the crystal size can extend beyond the size limitation imposed by the droplet confined assembly. A visual feedback loop can be implemented to manage the temperature of the system to keep the crystal growing, which can occur at a predictable diffusion limited rate.

Figure 2B:
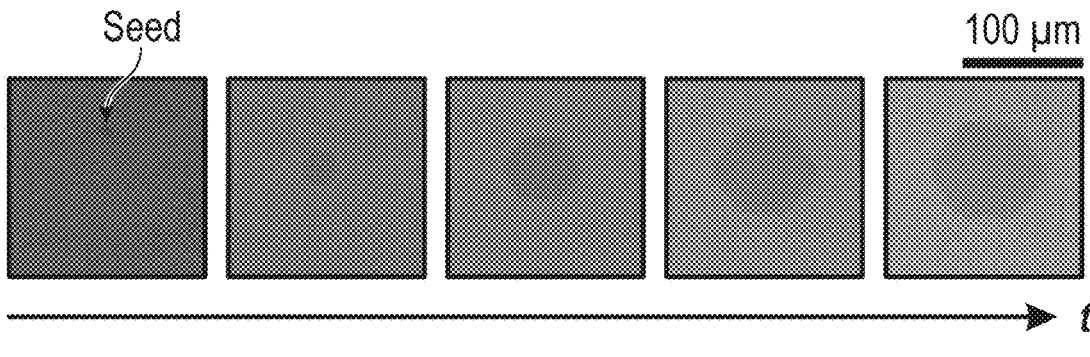
FIG. 2B illustrates micrographs showing growth of the seed crystals as a function of time (t) in accordance with one or more embodiments of the present disclosure.

Because of the seed crystal dilution in the colloidal suspension noted above, the seeds are effectively isolated from one another and are separated by at least a few multiples of the final crystal diameter at the end of the secondary growth field since the diffusion fields do not overlap. FIG. 2B depicts growth of the seed crystal as a function of time, wherein the seed crystal is effectively isolated from other seed crystals so that crystals can be grown by orders of magnitude in size. The size generally follows the scaling relation predicted by diffusion limited growth. At early times, the crystal size does not follow the same power-law scaling because the crystals begin with a finite initial size.

Figure 2C:
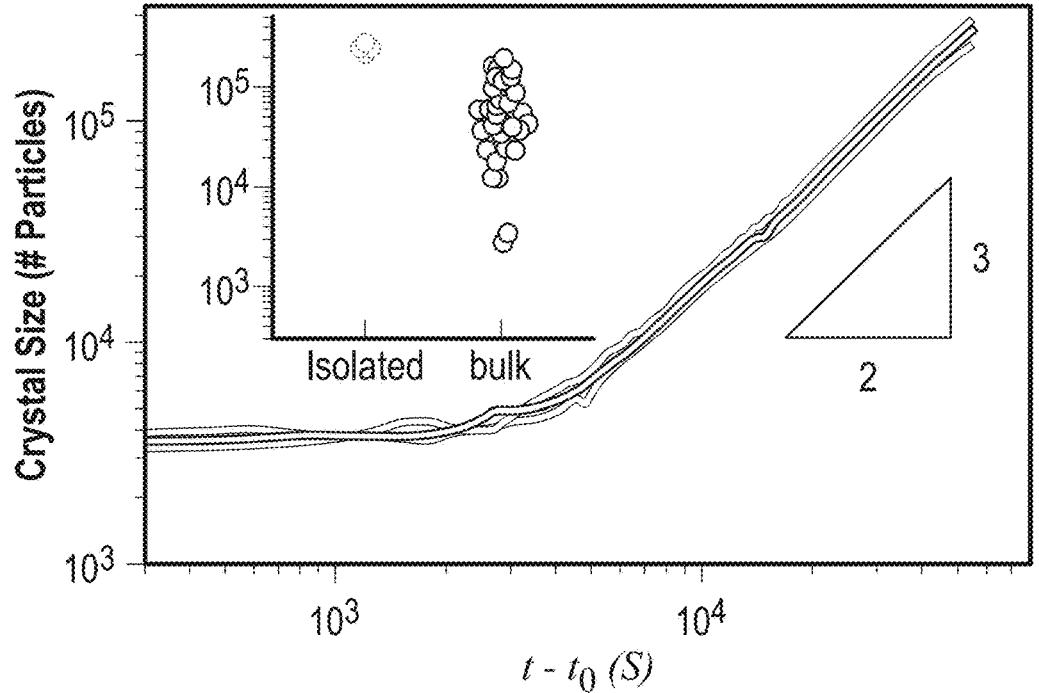
FIG. 2C graphically illustrates crystal size as a function of time comparing crystals obtained in accordance with the present disclosure and crystals obtained by prior art bulk nucleation processes.

Importantly, because all of the crystalline seeds grow in the same way, their final size distribution remains monodisperse. FIG. 2C shows that the standard deviation of the final crystal volumes is less than 10% of the mean. By contrast, the sizes of colloidal crystals obtained from prior art bulk nucleation processes vary by roughly two orders of magnitude, reflecting both the distribution of nucleation times as well as competition for free particles from neighboring growing crystals. The differences between the bulk and seeded nucleation experiments can be best understood by noting that uniform supersaturation of a bulk fluid leads to stochastic nucleation. Because the nucleation times are exponentially distributed, the time periods over which the various crystals can grow vary widely. The resulting distribution of final crystal sizes is therefore extremely broad. The formation of polycrystals is also apparent, since the initial nucleation events also occur randomly in space. Thus, unlike bulk nucleation processes, the deterministic growth behavior from seeded nucleation not only allows prediction of the duration of the secondary growth phase to grow a single-domain crystal of a prescribed size, but it also allows the fabrication of same-sized macroscopic colloidal crystals in a single sample.

Figure 3A:
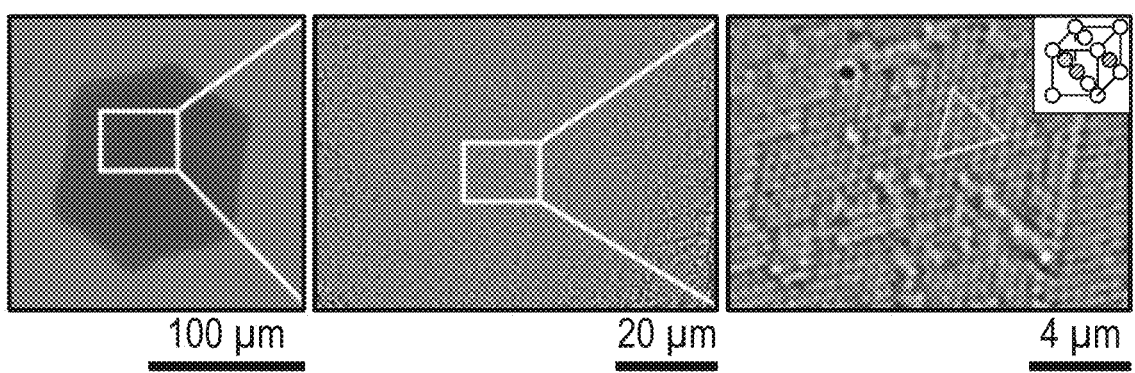
FIG. 3A illustrates micrographs of crystals containing about $2.5 \times 10^6$ of 600 nm diameter particles in accordance with one or more embodiments of the present disclosure.

The crystals obtained after the growth phase can be microscopically viewed to confirm the crystals are single crystals. As an example, FIG. 3A shows a large, faceted crystal made from 600-nm-diameter DNA modified polystyrene particles, in which the hexagonal symmetry of the CuAu (111) face is clearly discernible on the presented face. Microscopically inspecting the entire crystal facet shows that the lattice has the same symmetry and same orientational order throughout, indicating that there are no grain boundaries. Furthermore, the projected crystal faceting is itself hexagonal, exhibiting an average internal angle of 120° 5°, and has the same orientation as the crystalline lattice, both of which are consistent with a single domain.

Figure 3B:
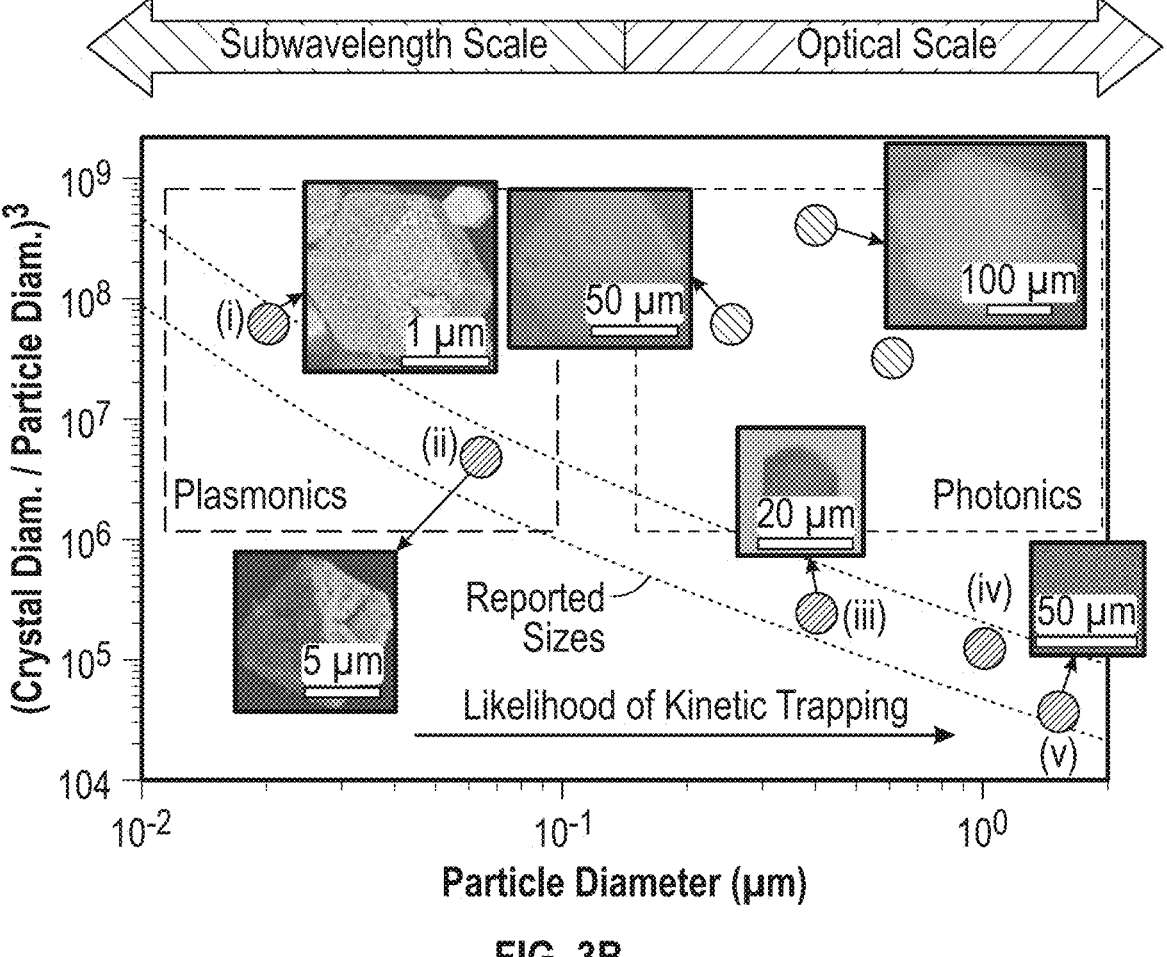
FIG. 3B graphically illustrates an overview of reported sizes of the largest crystals obtained using prior art bulk nucleation processes as a function of the constituent particle size spanning from sub-wavelength to wavelength scale particles.

In fact, the crystal shown in FIG. 3A is orders of magnitude larger in volume than any crystal made from similar-size particles reported in the literature, highlighting the strength of the two-step process. Indeed, plotting the estimated crystal sizes from the prior art literature versus the particle diameter clearly illustrates the challenge that the field has faced in making bulk self-assembled materials from optical-scale particles: whereas the largest single crystals made from 20-nm-diameter particles contain roughly 100 million particles, and the kinetic limitations associated with forming crystals from micrometer-diameter particles have restricted such crystals to having 1000-fold fewer particles per crystallite. A direct consequence is that, prior to the two-step process described above, the region of parameter space corresponding to bulk photonic crystals made in accordance with the literature (see particles labeled (i) to (v)) was completely vacant as indicated in the box shown in upper right-hand corner of FIG. 3B. Crystals from 250-nm-diameter and the 600-nm-diameter particles were grown in a suspension of 1% particles (v/v); the 400-nm-diameter-particle crystals were grown in a suspension of 1.5% (v/v). The crystals were grown over a period of about 2 days. The two-step process as described herein breaks this trend allowing well-faceted crystals to be grown multipole orders of magnitude larger than prior processes, which now populate the box shown in upper right-hand corner of FIG. 3B.

The two-step process as described herein enables population of this space and creates macroscopic photonic crystals using DNA-programmed crystallization. Crystals that exhibit bulk optical properties by executing the two-step process using particles with diameters of 250 nm, 400 nm, and 600 nm have been demonstrated. For each particle size, self-assembly of similarly large single crystals rival the sizes of crystals formed from nanometer scale particles. Owing to size of the constituent building blocks, together with the size and quality of the crystalline assemblies, the crystals obtained using the two-step process also show pronounced photonic properties. For example, the 250-nm-diameter-particle crystals exhibit a prominent stop band for frequencies corresponding to red light and therefore exhibit structural coloration in reflected light. The 400-nm-diameter-particle crystals also exhibit green-yellow coloration in reflection, which is believed to result from second order diffraction and explains why the apparent color is a shorter wavelength even though the particle size is larger as compared to the 250-nm-diameter-particle crystals. Clearly, the two-step process enables the robust assembly of macroscopic single crystals from DNA-coated colloids that can grow to macroscopic sizes visible to the naked eye.

As noted above, microfluidic devices are utilized to create the water in oil emulsion of the droplets, wherein the microfluidic devices can be formed lithographically. By way of example, a photoresist can be deposited at a thickness of about 20 to about 80 microns onto a substrate such as silicon and heated at an elevated temperature. A photomask with the microfluidic device pattern is placed on the photoresist/substrate and exposed to activating radiation such as ultraviolet light to cure exposed portions of the photoresist. The undeveloped portions are then removed using a suitable solvent to provide a master pattern on the substrate, which is a negative of the actual microfluidic device. A mixture including a polymer such as polydimethylsiloxane (PDMS) and crosslinker are deposited onto the patterned surface and cured. A coring tool such as is available as part number 69039-07 from Electron Microscopy Sciences is used to provide openings in the device inlets and outlets. A glass slide is then bonded onto the PDMS layer in an oxygen plasma cleaner. Syringe pumps can be used to operate the microfluidic device to produce monodisperse aqueous droplets containing DNA coated colloidal particles. The flow rates of the oil and aqueous phases depend on the desired droplet size and the thickness of the microfluidic device being used, which are generally between 400 µl/hr and 1000 µl/hr. The droplet size can be verified via brightfield microscopy. The microfluidic devices are configured to create the water in oil emulsion of nanoliter scale droplets that are filled with a binary solution of the DNA coated colloidal particles.

Figure 4:
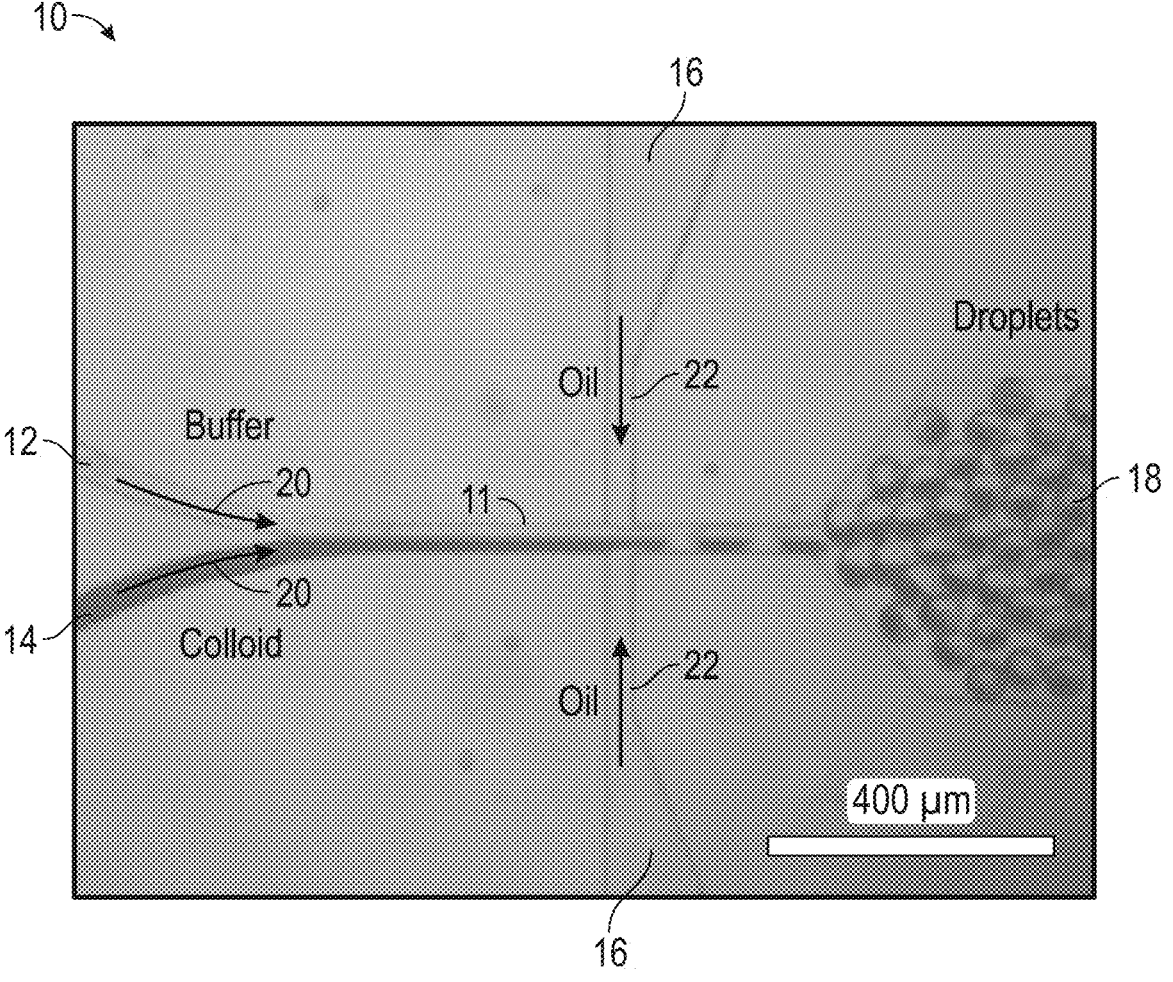
FIG. 4 pictorially illustrates an exemplary microfluidics device for forming a water-in-oil emulsion including aqueous droplets filled with DNA coated colloidal particles in accordance with embodiments of the present disclosure.

An exemplary microfluid device, generally designated by reference numeral 10, is depicted in FIG. 4. The device 10 includes multiple inlets 12, 14, 16, fluidly connected to a channel 11 and an outlet 18. The inlets 12, 14 are introduction of the aqueous phase into the channel, wherein the inlets can be configured for introducing the DNA-coated colloids and for introducing an aqueous buffer solution that collectively converge within the channel 11 to form an aqueous mixture. Inlets 16 are provided for introducing the oil into the channel and are perpendicularly positioned along the channel 11 at a location downstream of the aqueous phase inlets 12, 14. The water in oil emulsion is formed upon mixing of the oil from inlets 16. The device 10 further includes the outlet 18 for the collecting droplets formed in the water in oil emulsion. Arrows 20 illustrates the flow direction of the two aqueous inlet streams from inlets 12, 14, which converge into a single stream within the channel 11 before being exposed to the fluid flow as indicated by arrow 22 of the oil phase from inlets 16. The aqueous phase is squeezed into water in oil emulsified droplets upon mixture with the oil phase. The droplets subsequent to nucleation and the formation of seed crystals within the droplets can be collected using an Eppendorf tube, for example.

The DNA coated colloidal particles can be prepared through a number of synthetic routes. For example, DNA oligonucleotides can be attached to a polymer through ligand-receptor binding, physical grafting, or covalent attachment Regardless of the synthetic route, the particles attract one another through the formation of DNA "bridges." A bridge forms when a strand grafted to one particle directly hybridizes to a strand grafted to a second particle, or when the two grafted strands hybridize with a third strand called a "linker". The particles can be uniformly coated with single stranded DNA or coated on well-defined patches with different valences to provide the desired crystal symmetry. By way of example, single stranded DNA can be covalently grafted onto the particle surfaces by a strain promoted alkyne-azide cycloaddition reaction (SPAAC). The particular DNA is not intended to be limited and is generally selected to include a strained alkyne such as dibenzocyclooctyne (DBCO) at the 5' terminus, a flexible spacer portion, and a sticky end at the 3' terminus. The flexible spacer portion provides length to the DNA and can include a plurality of inert bases such as a long string of "T" nucleotide bases. The number of bases for the flexible spacer portion is not intended to be limited so long as they are inert and can vary depending on the intended application. Generally, the number of bases for the flexible spacer portion ranges from about 40 to about 60 bases, although greater or lesser number of bases can be employed. The sticky ends of the two particles, i.e., the actionable portion of the DNA, generally has greater than 4 nucleotide bases to less than 25 nucleotide bases connecting each other, although greater or lesser bases could be employed. The sticky end provides specific binding to complementary strands via DNA hybridization.

In one or more embodiments, the DNA-coated colloidal particles can be prepared by functionalizing colloidal particles such as polystyrene with DNA oligonucleotides using a combination of strain-promoted dibenzocyclooctyne (DBCO) click chemistry and physical grafting. By way of example, DNA-coated colloidal particles can be synthesized by functionalizing polystyrene-block-poly(ethylene oxide) (PS-b-PEO) with an azide group ($N_3$), which can then be absorbed onto the surface of polystyrene colloidal particles. DCBO modified DNA is then attached to the azide group of PS-b-PEO-$N_3$ via click chemistry.

By way of example, PS-b-PEO can be functionalized by attaching a mesyl group via methanesulfonyl chloride and then the mesyl group is replaced using sodium azide to form PS-b-PEO-$N_3$. The PS-b-PEO-$N_3$ is then absorbed onto the surface of 600 nanometer nm colloidal polystyrene particles by swelling the polystyrene colloidal particles in tetrahydrofuran in an aqueous solution of the PS-b-PEO-$N_3$. Deionized water is then added to de-swell the particles, which are then washed multiple times and resuspended in deionized water. DCBO-modified DNA is then attached to the azide functionality of PS-b-PEO-$N_3$ via click chemistry in a solution of tris-EDTA buffer (pH=8), a pluronic F-127 surfactant, and sodium chloride. Sequences of the DNA strands are rationally designed to self-assemble into complex architectures through complementary base-pairing interactions. By way of example, two exemplary DNA sequences including the flexible spacer and the sticky portion can include SEQ.01: 5'-$(T)_{51}$-GAGTTGCGGTAGAC-3' and SEQ.02: 5'-$(T)_{51}$-AATGCCTGTCTACC-3'.

Although reference is made to polystyrene particles, the present disclosure is not intended to be limited to polystyrene particles. Other particles include, without limitation, inorganics such as silica, titania, organosilica, and the like; organics such as poly(methyl methacrylate) [please provide] and the like; and hybrid structures such as silica-methacrylate and the like. Additionally, the linking group of a PS-b-PEO block copolymer is not intended to be limited to these block copolymers. Other block copolymers are generally known by those skilled in the art, e.g., pluronic 108, which is a poly (ethylene glycol)-poly (propylene glycol) triblock copolymer, and can be used with amine modified DNA, for example. It should also be noted that reference to 600 nm polystyrene particles is exemplary. Smaller or larger particles can also be utilized as may be desired for different applications.

EXAMPLES

Example 1. Synthesis of DNA Coated Colloidal Particles

In this example, DNA coated colloidal particles are synthesized using a combination of strain-promoted dibenzocyclooctyne (DBCO) click chemistry and physical grafting. Polystyrene-block poly(ethylene oxide) (PS-b-PEO) (Mw=6500 g/mol and 3800 g/mol, Polymer Source, Inc.) is first functionalized with an azide group by attaching a mesyl group via methanesulfonyl chloride (471259, Sigma-Aldrich) followed by replacing the mesyl group with an azide group ($N_3$) using sodium azide S2002-5G, Sigma-Aldrich) to form PS-b-PEO-$N_3$. The PS-b-PEO-$N_3$ is incorporated onto the surface of 600-nm-diameter polystyrene particles (S37495, Molecular Probes) by swelling the particles with tetrahydrofuran (THF, 99.9% inhibitor free 401757, Sigma-Aldrich) in an aqueous solution of PS-b-PEO-$N_3$. Next, additional deionized (DI) water is added to the solution in order to de-swell the particles. The particles are washed five times by repeated centrifugation and resuspended in DI water. Finally, DBCO-modified DNA molecules are attached to the PS-b-PEO-$N_3$ via a click reaction with the azide groups in a solution of tris-EDTA buffer (pH 8), pluronic F-127 (51181981, Sigma-Aldrich), and sodium chloride. The reaction mixture is rotated end-over-end in an oven at 60° C. for 24 hours and then washed five times in DI water. The particles at a concentration of 1% (v/v) in DI water are stored at 4° C. The particles are coated with DNA sequence A as illustrated by SEQ.01: 5'-(T)51-GAGTTGCGGTAGAC-3'; or with DNA sequence B as illustrated by SEQ.02: 5'-(T)51-AATGCCTGTCTACC-3'. Both DNA sequences are obtained from Integrated DNA Technologies (IDT) and are purified by high-performance liquid chromatography.

Example 2. Droplet Formation

In this example, droplets of the DNA coated colloidal particles obtained in Example 1 are made in a water in oil emulsion produced using the polydimethylsiloxane (PDMS)-based microfluidic device as shown in FIG. 4. The droplets are stabilized by a fluorinated surfactant (RAN) suspended in fluorinated oil (HFE-7500) at a concentration of 2%. The droplets contain an aqueous solution of the colloidal particles, 5 mM Tris/0.5 mM EDTA buffer, and 500 mM NaCl.

Syringe pumps are used to operate the microfluidic device to produce monodisperse droplets containing colloidal suspension of DNA coated colloidal particles. First, the channels of the microfluidic device are made hydrophobic by flushing them with Aquapel (B004NFW5EC, Amazon), leaving it for 30 seconds, and then flushing the channels out again with air to remove the Aquapel. The process is repeated with HFE-7500 oil and then air. Oil and aqueous buffer are introduced through their respective inlets to ensure the device functions properly. The flowrates of three 3-ml syringes independently are controlled with the syringe pumps (98-2662, Harvard Apparatus) connected to the device via tubing (06417-11, Cole-Palmer) that is slightly larger in diameter than the holes to ensure a snug fit. One syringe feeds in the HFE-7500 (3 M) with 2% RAN fluorosurfactant (008-FluoroSurfactant-5wtH-20G, RAN Biotechnologies). The other two syringes feed in aqueous solutions, which are combined on-chip as generally shown in FIG. 4. One of the aqueous phases contains 1 M NaCl in 1×TE buffer (1 mM EDTA/10 mM Tris), and the other contains either DI water or the DNA-coated particles suspended at twice the desired volume fraction in DI water. Flow rates of 800 ml/hr are utilized for the oil phase and 400 ml/hr for each of the aqueous phases to obtain droplets within a water in oil emulsion having diameters of roughly 60 micrometers. It should be apparent that different flow rates can be used to provide different diameters.

Due to the small amount of DNA-coated colloids that are produced, a syringe is filled with HFE-7500 and the end of the tube connected to this syringe is placed into an Eppendorf containing the colloidal suspension. A syringe pump is operated in reverse to pull a 10 µl-volume plug of the colloidal suspension into the tube. A millimeter-long plug of air is then pulled into the tube followed by enough 1×TE to fill approximately 0.5 m of tubing. The extra volume of buffer ensures that the droplets are uniform before our colloidal suspension passes through the microfluidic device. Since the particle-filled fluid is separated by a cushion of air on both sides, the particles move through the tubing and the device as a uniform plug and do not spread due to Taylor dispersion. We collect the resulting droplets in an Eppendorf microcentrifuge tube at the exit of the outlet tubing. These droplets remain stable in solution for a period of many months.

Example 3. Seeded Growth

In this example, droplets filled with crystals are mixed in an Eppendorf tube with droplets filled with weak particles that have half the DNA grafting density as compared to the seed particles. To get an acceptably low density of seeds in the final experiment, 1 µl of droplets with seed crystals is added to 4 µl of droplets with weak particles. Then 1 µl of this mixture is added to 4 µl of droplets and so on for a total of three dilutions. Finally, a fourth dilution adds 1 µl of this diluted mixture to 9 µl of droplets containing weak particles. This solution is then loaded into a capillary until the capillary is completely full, sealed using UV-glue (Norland Products, NOA68), and then cured for at least 10 minutes under a mercury vapor UV-lamp. The sample is brought to a microscope and is heated to a temperature at which the weak particles disassociate but the seeds remain intact (i.e., temperature is below the melting temperature of the seed crystals). The sample is then quickly brought to an analytical balance with an attached ionizer (Mettler Toledo XSE104) and is gently moved back and forth across the ionizer aperture for 30 seconds. The ionizer breaks the emulsion, combining the particles with the seed crystals. The sample is put on the microscope again and is heated using a thermoelectric cooler to melt the weak particles until the combined system is in equilibrium. The system starts at a temperature at which crystal growth does not occur and the temperature is automatically lowered in 0.05° C. steps until the reference crystal begins to grow. Reducing the temperature with time maintains a constant supersaturation and does not accelerate growth.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

---

---

What is claimed is:

1. A two-step process for forming DNA programmed crystals via seeded growth, the two-step process comprising:
a first step comprising nucleating single seed crystals in droplets formed in a water in oil emulsion by cooling the emulsion from above a melting temperature of the seed crystal to a nucleation temperature, wherein each of the monodisperse droplets comprise a binary suspension of DNA coated colloidal particles having a first grafting density of DNA; and
a second step comprising growing the single seed crystals to form larger three-dimensional crystals by mixing a portion of the monodisperse droplets containing the single seed crystals with monodisperse droplets containing weakly DNA coated colloidal particles, wherein the weakly DNA coated colloidal particles have a second grafting density of DNA less than the first grafting density followed by breaking the emulsion to form a metastable colloidal suspension including the seed crystals, and annealing the metastable colloidal suspension at a temperature greater than the melting temperature of the weakly DNA coated particles and less than a melting temperature of the seed crystal to form the larger three-dimensional crystals, wherein growth of the seed crystals is diffusion limited, and wherein the melting temperature of the weakly DNA coated particles is greater than a nucleation temperature during the growing.

2. The two-step process of claim 1, wherein cooling the emulsion in the first step continues until all of the DNA coated colloidal particles in each monodisperse droplet are incorporated into the seed crystal.

3. The two-step process of claim 1, wherein breaking the emulsion comprises exposing the emulsion to an ionizer.

4. The two-step process of claim 1, wherein the DNA in the DNA coated particles and the weakly DNA coated particles comprise a sticky end portion having less than about 25 complementary nucleotides.

5. The two-step process of claim 1, wherein the DNA coated colloidal particles and the weakly comprise DNA functionalized polystyrene particles.

6. The two-step process of claim 1, wherein growing the single seed crystals to form larger three-dimensional crystals comprises attaching the particles in the metastable colloidal suspension to a crystal surface at a higher temperature than that at which nucleation occurs.

7. The two-step process of claim 1, wherein nucleating the single seed crystals continues until all of the DNA coated colloidal particles within the droplet are incorporated into the crystal phase.

8. The two-step process of claim 1, wherein the nucleating temperature is decreased in a staircase fashion at defined temperature intervals.

9. The two-step process of claim 1, wherein the ratio of droplets containing the single seed crystals to monodisperse droplets containing the weakly DNA coated colloidal particles is between about 0.1% to about 0.01%.

10. The two-step process of claim 1, wherein the water in oil emulsion is made by microfluidics.

11. A process for growing macroscopic crystals, comprising:
mixing droplets containing seed crystals formed from DNA coated colloidal particles with droplets containing weak DNA coated colloidal particles having a lower nucleation temperature than the droplets containing seed crystals from the DNA coated colloidal particles;
breaking the emulsion to form a metastable DNA coated colloidal particle suspension including the seed crystals;
annealing the mixture at a temperature above the nucleation temperature of the weak DNA coated particles but below a melting temperature of the seed crystals; and
decreasing the temperature to grow larger crystals from the seed crystals with the weak DNA coated colloidal particles.

12. The process according to claim 11, wherein the larger crystals have a size within 10 percent of an average sized large crystal.

13. The process according to claim 11, wherein annealing the mixture at a temperature above a homogenous nucleation temperature of the weak DNA coated particles but below a melting temperature of the seed crystals lowers supersaturation.

14. The process according to claim 11, wherein decreasing the temperature comprises incremental decreases in a staircase fashion for a defined interval.

\* \* \* \* \*